(12) United States Patent
Chu et al.

(10) Patent No.: US 7,622,782 B2
(45) Date of Patent: Nov. 24, 2009

(54) PRESSURE SENSORS AND METHODS OF MAKING THE SAME

(75) Inventors: Stanley Chu, Cupertino, CA (US);
Sisira Kankanam Gamage, Fremont, CA (US); Hyon-Jin Kwon, Fremont, CA (US)

(73) Assignee: General Electric Company, Schenectady, NY (US)

( * ) Notice: Subject to any disclaimer, the term of this patent is extended or adjusted under 35 U.S.C. 154(b) by 115 days.

(21) Appl. No.: 11/210,309

(22) Filed: Aug. 24, 2005

(65) Prior Publication Data
US 2007/0052046 A1   Mar. 8, 2007

(51) Int. Cl.
*H01L 29/84* (2006.01)

(52) U.S. Cl. .................. 257/415; 257/467; 257/909; 257/470; 257/E27.006; 438/909

(58) Field of Classification Search ............ 257/415, 257/467, 909, 470, E27.006
See application file for complete search history.

(56) References Cited

U.S. PATENT DOCUMENTS

| | | | |
|---|---|---|---|
| 4,291,293 A | | 9/1981 | Yamada et al. |
| 4,525,766 A | | 6/1985 | Petersen |
| 4,800,758 A | * | 1/1989 | Knecht et al. ........... 73/727 |
| 4,802,952 A | | 2/1989 | Kobori et al. |
| 5,095,349 A | * | 3/1992 | Fujii et al. ............ 257/108 |
| 5,157,973 A | | 10/1992 | Ciminelli |
| 5,231,301 A | | 7/1993 | Peterson et al. |
| 5,273,205 A | | 12/1993 | Ju et al. |
| 5,591,679 A | | 1/1997 | Jakobsen et al. |
| 5,600,071 A | | 2/1997 | Sooriakumar et al. |

(Continued)

FOREIGN PATENT DOCUMENTS

| | | | |
|---|---|---|---|
| EP | 1 359 402 A | | 11/2003 |
| EP | 1 522 521 A1 | | 4/2005 |
| JP | 10-325772 | * | 8/1998 |
| WO | WO/00/02028 A | | 1/2000 |
| WO | WO/2004/050546 A | | 6/2004 |

OTHER PUBLICATIONS

International Search Report; PCT/US2006/032858 with an International Filing Date of Aug. 22, 2006.
High Pressure Sensor Based on Fusion Bonding, Birkelund et al., presented at 2001 Joint International Meeting of The Electromechanical Society, Inc. and International Society of Electrochemistry in San Francisco, CA on Sep. 2-7, 2001.
MIL-STD-883E, dated Mar. 14, 1995.

*Primary Examiner*—Wael Fahmy
*Assistant Examiner*—Marc Armand
(74) *Attorney, Agent, or Firm*—Cantor Colburn LLP

(57) ABSTRACT

A pressure sensor includes a base substrate silicon fusion bonded to a cap substrate with a chamber disposed between the base substrate and the cap substrate. Each of the base substrate and the cap substrate include silicon. The base substrate includes walls defining a cavity and a diaphragm portion positioned over the cavity, wherein the cavity is open to an environment to be sensed. The chamber is hermetically sealed from the environment.

19 Claims, 11 Drawing Sheets

U.S. PATENT DOCUMENTS

| | | |
|---|---|---|
| 6,038,928 A | 3/2000 | Maluf et al. |
| 6,074,891 A | 6/2000 | Staller |
| 6,406,636 B1 | 6/2002 | Vaganov |
| 6,472,244 B1 | 10/2002 | Ferrari et al. |
| 6,629,465 B1 | 10/2003 | Maluf et al. |
| 6,647,794 B1 * | 11/2003 | Nelson et al. .................. 73/718 |
| 7,197,939 B2 * | 4/2007 | Sakai et al. ................... 73/754 |
| 2003/0019299 A1 * | 1/2003 | Horie et al. ................... 73/718 |
| 2005/0037534 A1 | 2/2005 | Sawyer |

* cited by examiner

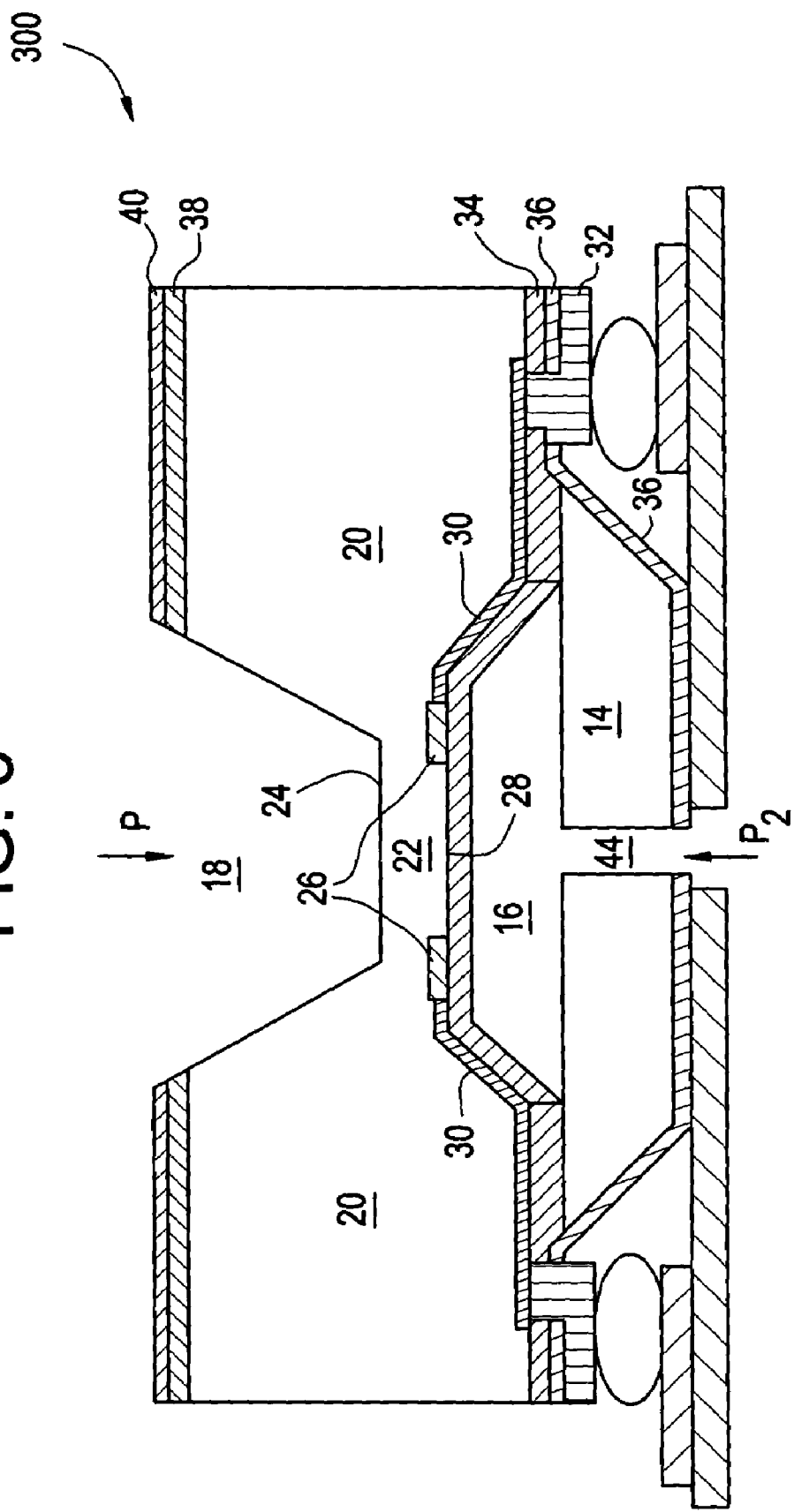

PRESSURE SENSORS AND METHODS OF MAKING THE SAME

BACKGROUND

Microelectromechanical systems (MEMS) based pressure sensors are being incorporated into such diverse equipment as medical instruments, laboratory instruments, industrial equipment, and automotive circuitry. A significant number of applications are becoming important where pressure sensor devices are exposed to harsh environments. Such environments include solvent mixtures (e.g., fuel), water (e.g., salt water), acids, and bases. End users of pressure sensors have found that standard devices fail in such environments.

For example, one type of pressure sensor measures absolute pressure. The absolute pressure sensor is made by forming a cavity within a first silicon wafer and then attaching a second silicon wafer to the first wafer and thinning the second wafer above the cavity, thereby providing a diaphragm over a sealed chamber. Piezoresistors formed on or adjacent to the diaphragm measure pressure by sensing how much the pressure acting on the front side of the diaphragm deflects the diaphragm into the sealed chamber. In this example, upon exposure to a harsh environment, corrosion often occurs, for example, at interconnects of the piezoresistors, which causes the absolute pressure sensor to degrade or fail.

Accordingly, a continual need exists in the art for pressure sensors that are capable of being used in harsh environments.

SUMMARY

Disclosed herein are pressure sensors and methods of making the pressure sensor.

One embodiment of a pressure sensor includes a base substrate silicon fusion bonded to a cap substrate with a chamber disposed between the base substrate and the cap substrate. Each of the base substrate and the cap substrate include silicon. The base substrate includes walls defining a cavity and a diaphragm portion positioned over the cavity, wherein the cavity is open to an environment to be sensed. The chamber is hermetically sealed from the environment.

One embodiment of a method of making a pressure sensor includes forming an oxide layer and a nitride layer on a base substrate, implanting or diffusing a p-type dopant into the base substrate to form each of a piezo-resistor and a conductive pathway such that the oxide layer and the nitride layer cover each of the piezo-resistor and the conductive pathway, silicon fusion bonding a cap substrate including a cap cavity to the base substrate to hermetically seal the cavity to form a chamber, etching away a portion of the base substrate to form a base cavity defined by walls created by the etching and diaphragm portion of the base substrate. The base substrate is an n-type substrate comprising silicon with the oxide layer disposed on the base substrate and the nitride layer disposed on the oxide layer. The cap substrate includes silicon. The conductive pathway is in electrical communication with the piezo-resistor, wherein piezo-resistor is disposed in physical communication with the diaphragm portion.

The above-described and other features will be appreciated and understood by those skilled in the art from the following detailed description, drawings, and appended claims.

BRIEF DESCRIPTION OF THE DRAWINGS

Referring now to the figures, which are exemplary embodiments, and wherein the like elements are numbered alike:

FIG. 5 is an embodiment of a differential pressure sensor.

DETAILED DESCRIPTION

As will be explained in greater detail throughout this disclosure, it has been discovered that a backside microelectromechanical systems (MEMS) based pressure sensor (hereinafter referred to as a pressure sensor) including a first substrate (wafer) and second substrate (wafer), which are silicon fusion bonded together, allows the pressure sensor to be operated in harsh environments (e.g., solvent mixtures (e.g., fuel), water (e.g., salt water), acids, and bases). The pressure sensors are backside pressure sensors, in which piezoresistors (also referred to a piezo-resistive elements) are disposed on, in, or proximate to (hereinafter "on" for convenience in discussion) a side of a diaphragm formed by one of the substrates opposite a side of the diaphragm exposed to the environment. Depending on the application, the pressure sensors can be an absolute pressure sensor or a differential pressure sensor.

Figure 1:
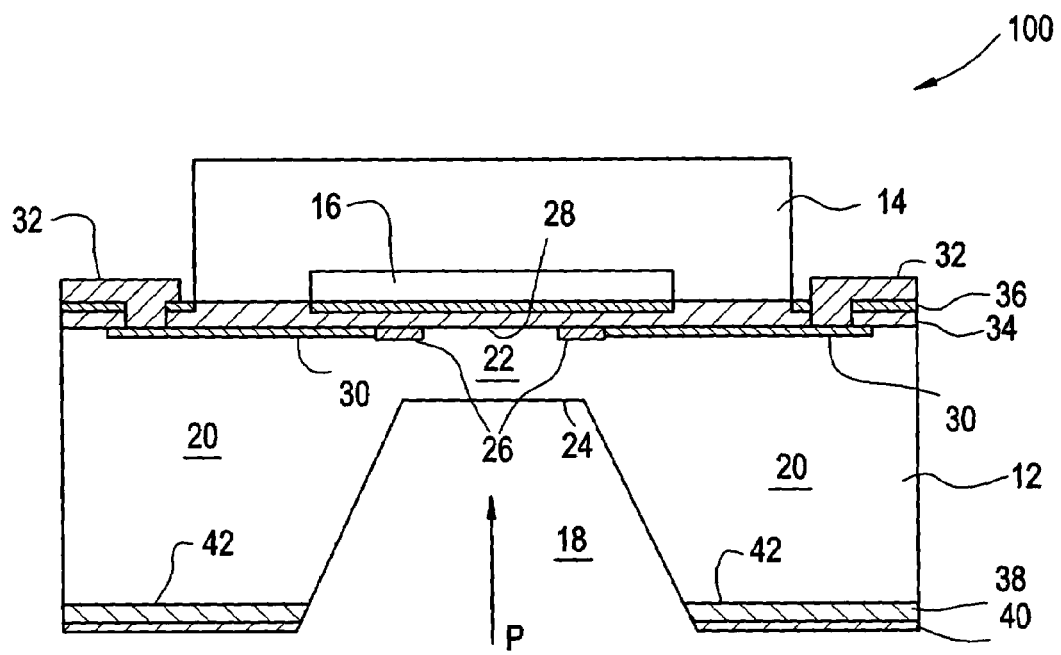
FIG. 1 is a cross sectional view of an embodiment of a backside absolute pressure sensor.

Referring now to FIG. 1, an embodiment of an absolute pressure sensor generally designated 100 is illustrated. The absolute pressure sensor 100 includes a base substrate 12, a cap substrate 14, and a chamber 16 disposed therebetween. The base substrate 12 and the cap substrate 14 each include silicon. In one embodiment, the base substrate 12 and the cap substrate 14 each are a multi-layer structure (e.g., a silicon-on-insulator type wafer). In yet other embodiments, the base substrate 12 and the cap substrate 14 are each a single-layer structure. It is advantageously noted that use of the single-layer structure can reduce the cost of the sensor compared to multi-layer structures.

Further, the base substrate 12 is an n-type substrate. For example, the silicon of the base substrate 12 is doped with an n-type dopant (e.g., phosphorous). The cap substrate 14 can be either an n-type substrate or a p-type substrate. When the cap substrate 14 is an n-type substrate, the cap substrate 14 can be doped with a similar or different n-type dopant as that employed in the base substrate 12. Moreover, when the cap substrate 14 is a p-type substrate, the cap substrate 14 is doped with a p-type dopant (e.g., boron).

The base substrate 12 includes a cavity 18, which is defined by walls created in a support portion 20 of the base substrate 12 and defined on a third side by a diaphragm portion 22 of the base substrate 12. Stated another way, the diaphragm portion is disposed over the cavity 18. Further, the cavity 18 exposes a first (environmental) side 24 of the diaphragm portion 22 to an environment to be sensed. For example, during operation the environment exerts a pressure, illustrated as line P, against the first side 24 of the diaphragm portion 22. The diaphragm portion 22 includes a thickness sufficient to allow the diaphragm to deflect under pressure from the environment. Piezo-resistive elements 26 are disposed on a second surface 28 of the diaphragm portion 22. For example, in one embodiment, the piezo-resistive elements 26 are disposed in a region of the diaphragm portion 22 that has the greatest stress during flexure of the diaphragm portion 22. The piezo-resistive elements 26 each include a resistance that varies with mechanical stress. The number, type, and arrangement of each piezo-resistive element 26 vary depending on the application. In one embodiment, the piezo-resistive elements 26 are arranged in a Wheatstone bridge circuit. During operation, the piezo-resistive elements 26 measure the flexion of the diaphragm portion 22 due the pressure form the environment. Suitable materials for the piezo-resistive element include, but are not limited, to p-type dopants (e.g., boron).

A conductive pathway 30, sometimes referred to as an interconnect, is disposed in electrical communication with the piezo-resistive elements 26. The conductive pathway 30 includes any electrical conductive material. For example, the conductive pathway 30 can include a portion of the base substrate 12, which has been doped with a p-type dopant. The conductive pathway 30 is disposed in electrical communication with an electrode 32, which is sometimes referred to as a wire bond pad, and the like. Suitable materials for the electrode 32 include metals (e.g., aluminum, titanium, platinum, gold, and combinations comprising at least one of the foregoing), alloys, and the like.

The conductive pathway 30 is disposed in physical communication with the base portion 12. A first oxide layer 34 (e.g., a silicon dioxide layer) is disposed in physical communication with the conductive pathway 30. For example, the first oxide layer 34 can be disposed on the conductive pathway 30 and at least a portion of the base substrate 12 (e.g., the second side of the diaphragm portion 22). Through holes are disposed in the first oxide layer 34 to allow electrical communication between the electrode 32 and the conductive pathway 30.

Disposed in physical communication with the first oxide layer 34 is first nitride layer 36. Through holes are disposed in the first nitride layer 36 corresponding to the location of the through holes disposed in the first oxide layer 34 to allow electrical communication between the electrode 32 and the conductive pathway 30. Without wanting be bound by theory, the first oxide layer 34 and the first nitride layer 36 each act as insulating layers and/or protective layers for the conductive pathway 30 and the piezo-resistive element 26. The first nitride layer 36 includes nitrides, including, but not limited to, silicon nitride. A second oxide layer 38 and a second nitride layer 40 are respectively disposed on a surface 42 of the base substrate 12, which is opposite, for example, the second side 28 of the diaphragm portion 22. These layers respectively include similar materials to those discussed in relation to first oxide layer 24 and first nitride layer 36. Further, the second oxide layer 38 and second nitride layer 40 each act as a protective coating during formation of cavity 18.

The base substrate 12 is silicon fusion bonded to the cap substrate 14 such that a chamber 16 is formed therebetween, which is hermetically sealed from a surrounding environment. Without being bound by theory, the hermaticity of the seal can readily be measured by a method consistent with United States military standard (MIL-STD)-883E. The base substrate 12 and the cap substrate 14 are bonded together in a vacuum such that chamber 16 is a vacuum chamber, which functions as a zero pressure reference when the diaphragm portion 22 is exposed to the environment. In the embodiment illustrated in FIG. 1, the chamber 16 is formed by a cavity in the cap substrate 14. Alternatively, a cavity can be disposed in the base substrate 12 to form the chamber 16. The length and width of the cavity forming chamber 16 is selected to correspond to at least a length and width of the diaphragm portion 22. The width of the cavity can be substantially uniform (e.g., the walls are substantially straight) or the walls of the cavity can converge toward the diaphragm portion 22 (e.g. the walls are tapered).

Figure 2A:
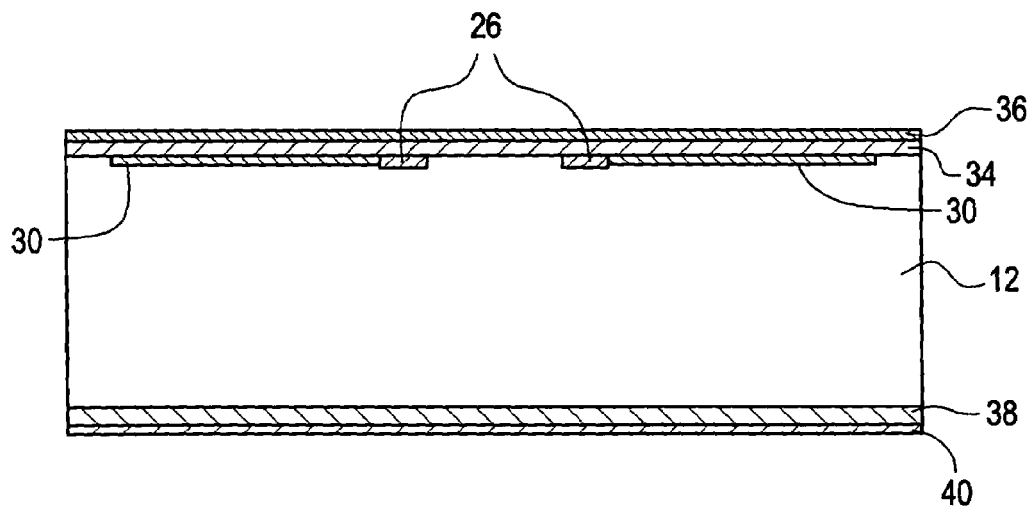
FIGS. 2(*a*)-2(*j*) collectively illustrate an exemplary method of making the embodiment of the backside absolute pressure sensor illustrated in FIG. 1.
Figure 2B:
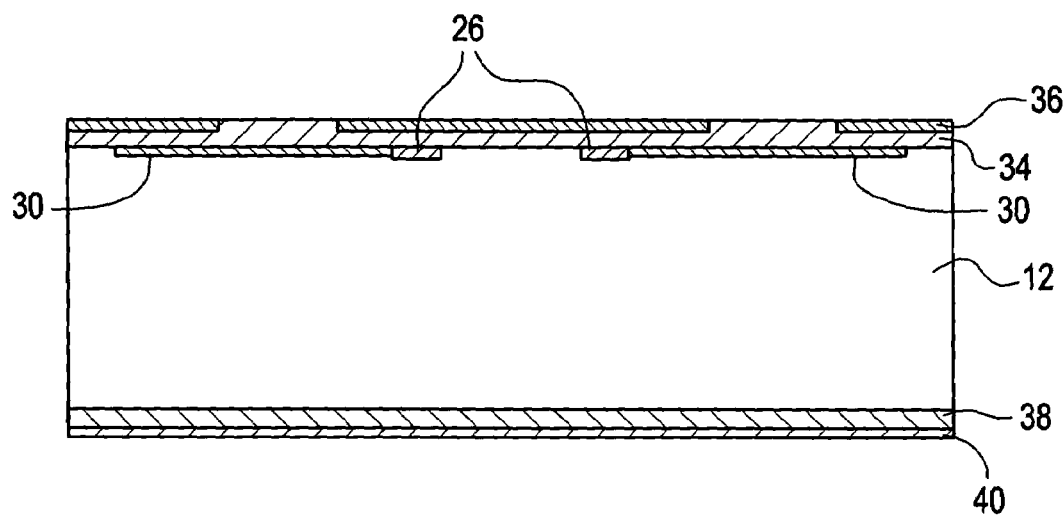
Figure 2C:
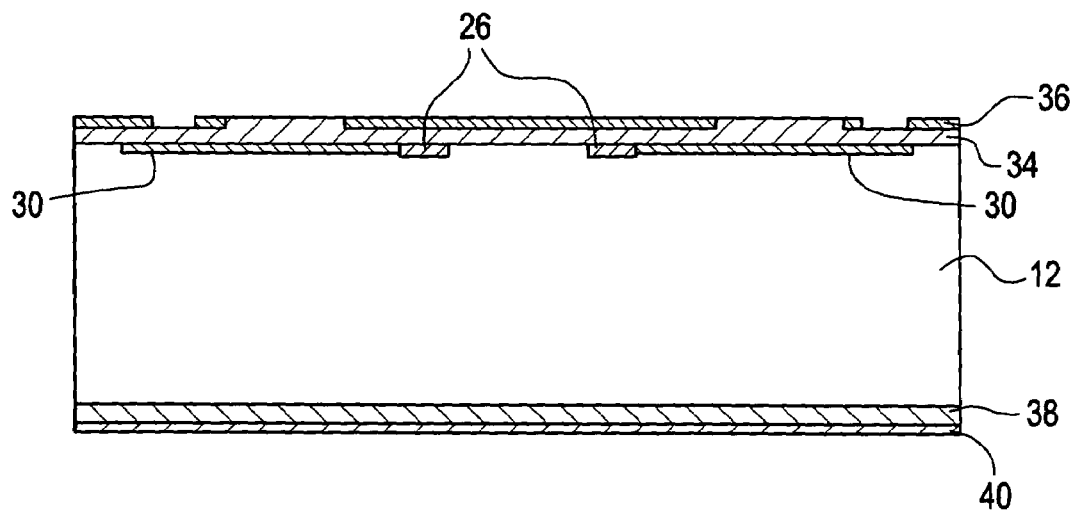
Figure 2D:
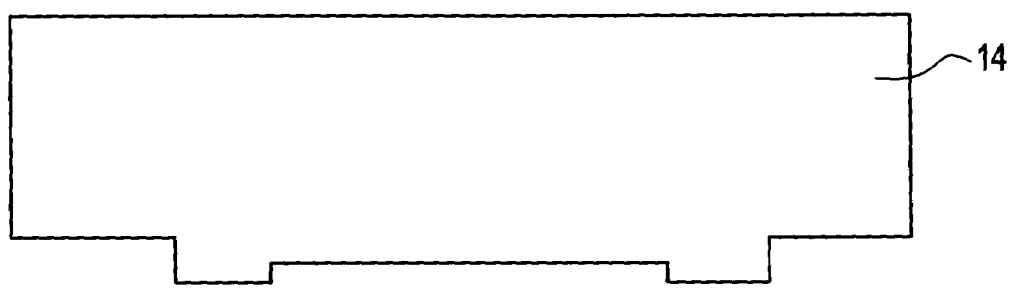

FIGS. 2(a)-(j) collectively illustrate an exemplary method of making the embodiment of the backside absolute pressure sensor in FIG. 1. In FIG. 2(a), the piezo-resistive element 26 and the conductive pathway 30 are formed on a surface of the base substrate 12 by, for example, ion implantation, diffusion, and the like. Materials for the piezo-resistive element 26 and conductive pathway 30 include those materials discussed above. FIG. 2(b) illustrates the selective etching away of a portion of the nitride layer 36 to form a bond area (e.g., a bond ring), which is followed by reoxidizing of the base substrate 12 to generate a thicker oxide portion of the first oxidizing layer in the bond area relative to the thickness of the first oxidizing layer 34 prior to etching and oxidizing. FIG. 2(c) illustrates the etching away a portion of the nitride layer 36, while leaving the oxide layer 34, at a location corresponding to the location of electrodes 32. FIG. 2(d) illustrates the cap substrate 14 including two step heights, which are formed on the cap substrate 14 by, for example, deep reactive ion etching. The step heights correspond to the desired size of the chamber 16 and are located to correspond to the bond area on the base substrate 12.

Figure 2E:
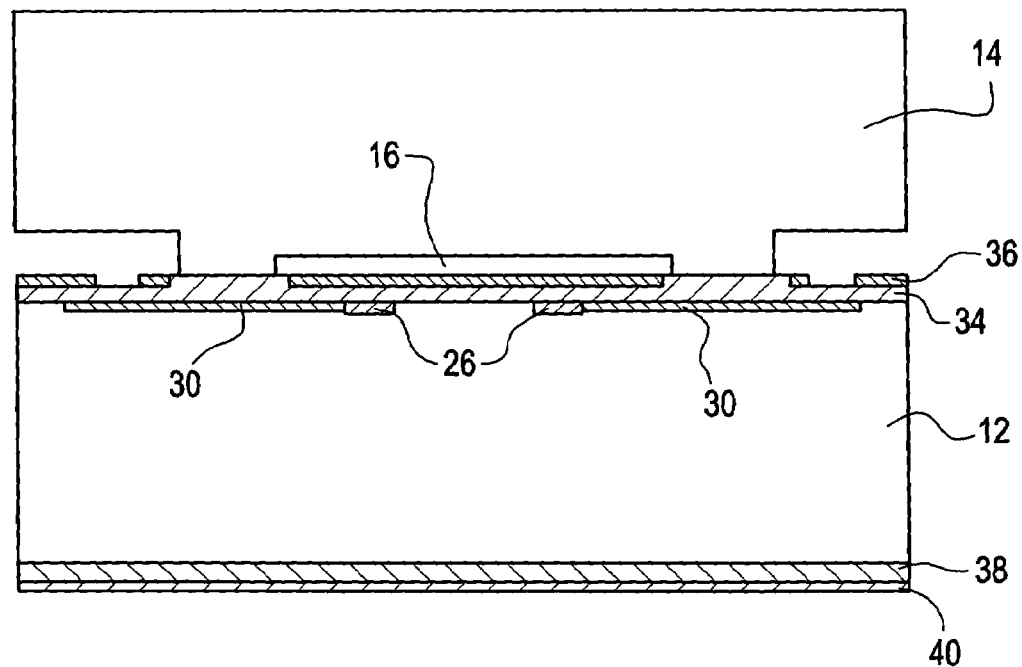

FIG. 2(e) illustrates the base substrate 12 being silicon fusion bonded to the cap substrate 14, which is an important feature in making the absolute pressure sensor 100. The base substrate 12 and the cap substrate 14 are bonded without any intermediate bond, alloy, adhesive, and the like. Further, silicon fusion bonding refers to the bonding of silicon to silicon or any combination of bonding silicon to a silicon oxide. In one embodiment, the silicon fusion bonding has a bond width of about 100 micrometers to about 150 micrometers. The use of silicon fusion bonding allows the pressure sensor 100 to have an active life of at least 10 years, which advantageously allows the absolute pressure sensor 100 to be employed in automotive applications.

Further, since silicon fusion bonding is employed, the overall cost of the absolute pressure sensor can be reduced compared to other devices that employ other bonding technologies. For example, a silicon substrate, which is bonded to another silicon substrate using an intermediate layer, has the additional costs associated with the bond material and added processing costs compared to silicon fusion bonding. More particularly, the cost of glass substrates and silicon-on-insulator (SOI) substrates are generally more expensive than the cost of standard silicon substrates. In a competitive market, any reduction in cost, while maintaining or increasing performance, is desirable in gaining market share.

Figure 2F:
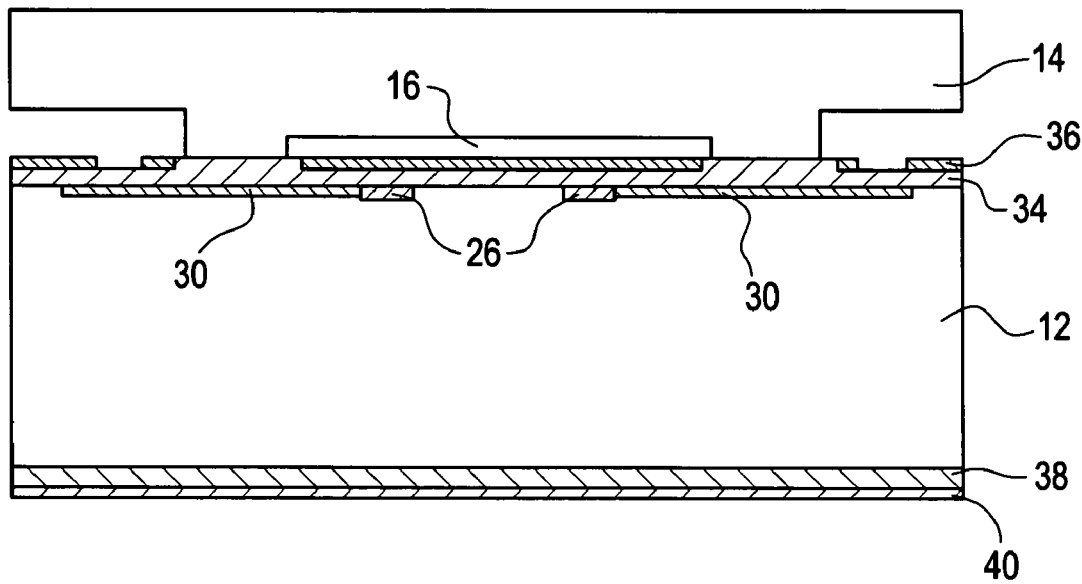

FIG. 2(f) illustrates the cap substrate 14 being thinned down using grinding and polishing to reduce the overall thickness of the cap substrate 14. The overall thickness of cap substrate 14 is up to about 400 micrometers, particularly about 50 micrometers to about 150 micrometers. A reduction in material corresponds to a reduction in the overall cost of the device. Moreover, a reduction in size in a pressure sensor allows the pressure sensor to be employed in a wider range of applications.

Figure 2G:
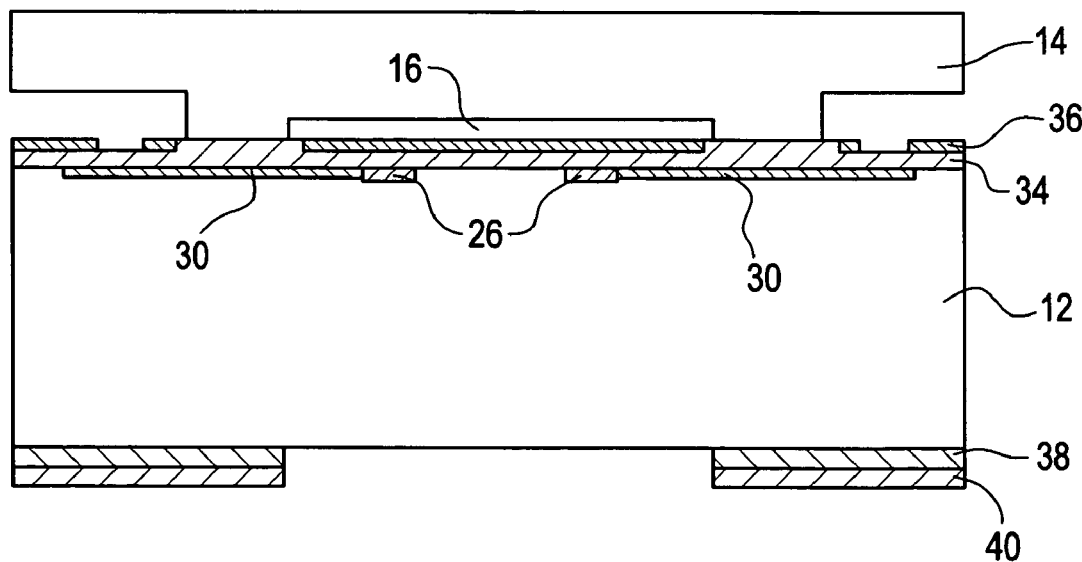
Figure 2H:
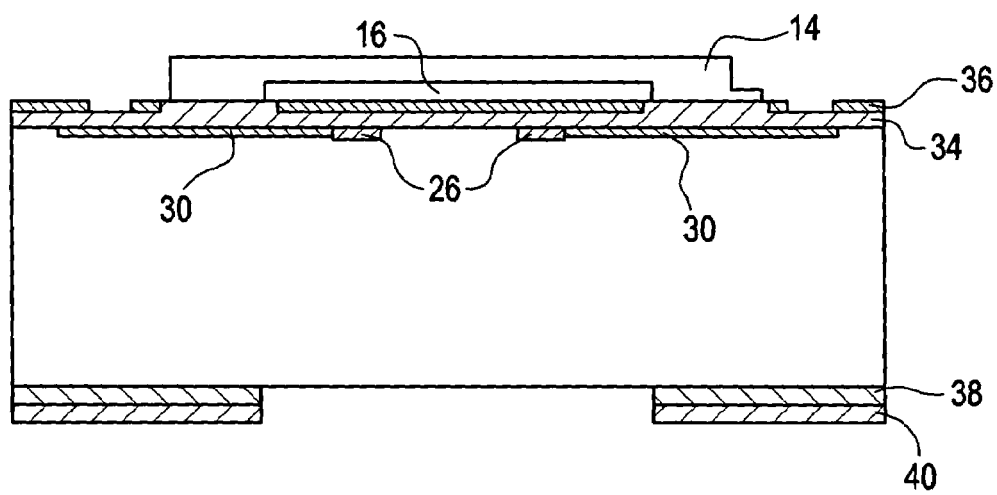
Figure 2I:
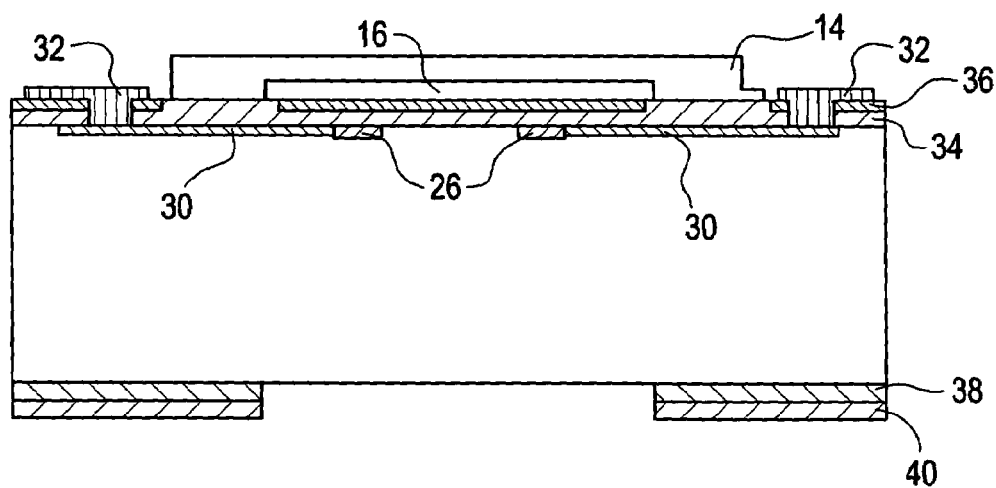

FIG. 2(g) illustrates a window being formed into the second oxide layer 38 and the second nitride layer 40 by selectively removing a portion of each layer using an etchant similar to the etchant discussed above in relation to the selective removal of first oxide layer 36. In FIG. 2(h), the cap layer is formed into a final shape, by for example etching. FIG. 2(i) illustrates electrodes 32 being formed by metallization in the area where a window (e.g., a through hole) is formed in each of the first oxide layer 34 and first nitride layer 26. Suitable metallization techniques include, but are not limited to, sputtering and electron beam evaporation deposition.

Figure 2J:
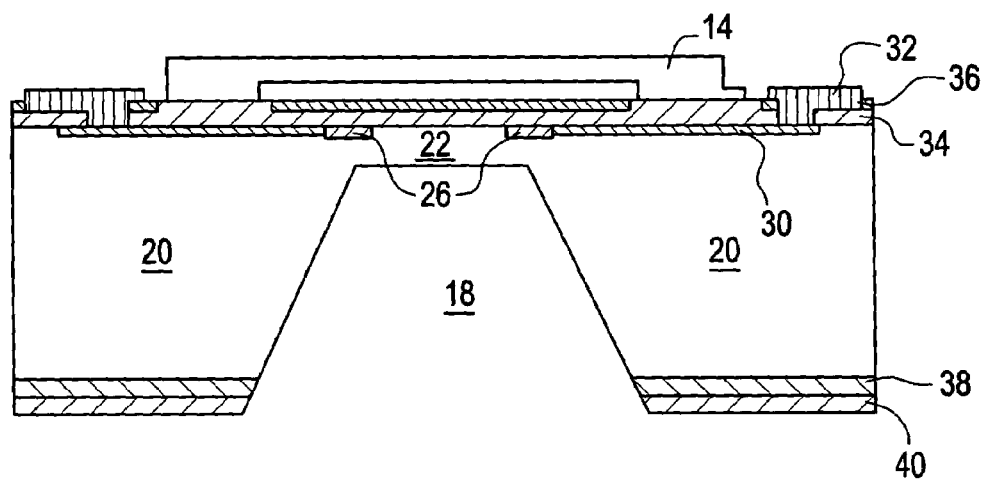

FIG. 2(j) illustrates the window formed in the second oxide layer 38 and the second nitride layer 40 being further opened (deepened) by for example, by etching, to form the cavity 18 and the diaphragm portion 22. For example, the cavity 18 is formed using an anisotropic etchant. Suitable anisotropic etchants include, but are not limited to, potassium hydroxide (KOH), tetramethyl ammonium hydroxide (TMAH), ethylene diamine pyrocatechol (EDP), and the like. The anisotropic etching forms the cavity 18 in the base substrate 12 having walls which generally converge from the surface 42 toward the first side 24 of the diaphragm portion 22 formed by the cavity 18. However, it is understood that in other embodiments, isotropic etching can be used to form the cavity 18. Suitable isotropic etchants include those known in the art, as well as others.

Figure 3:
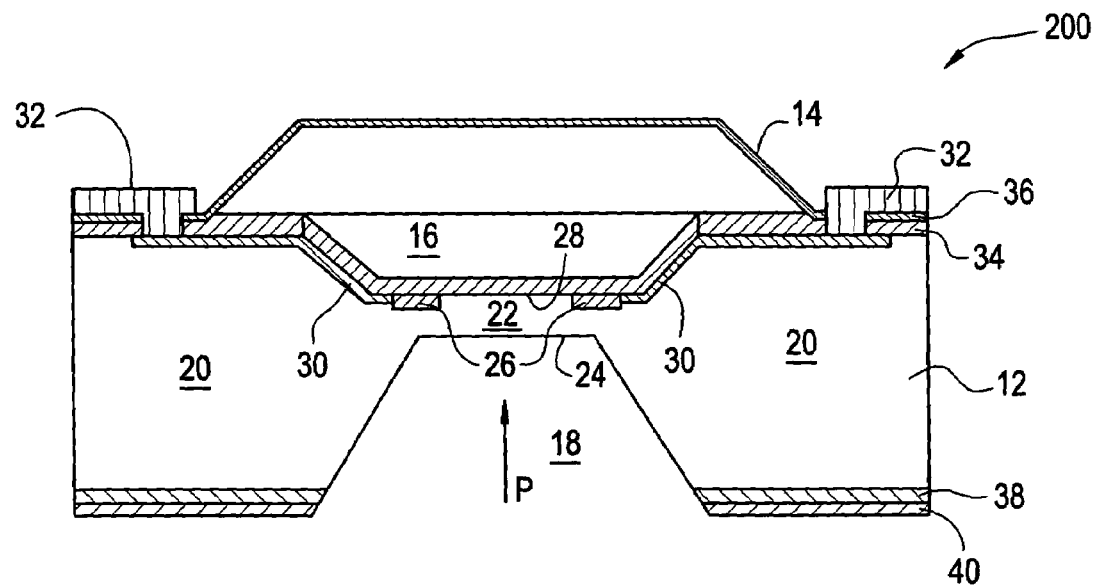
FIG. 3 is a cross sectional view of another embodiment of a backside absolute pressure sensor.

Referring now to FIG. 3, an embodiment of an absolute pressure sensor, generally designated 200, is illustrated. While the arrangement of the components of the absolute pressure sensor 200 are substantially the same as the arrangement illustrated by absolute pressure sensor 100, this embodiment is included herein to highlight that the shape of the chamber 16 and the shape of each substrate (e.g., cap substrate 14) can vary. Further, while the chamber 16 is disposed between the base substrate 12 and the cap substrate 14, the chamber 16 can be formed by a cavity in the base substrate 12, a cavity in the cap substrate 14, or a combination of the foregoing. In this example, the shape of the chamber 16 corresponds to the shape of the cap substrate 14.

Figure 4A:
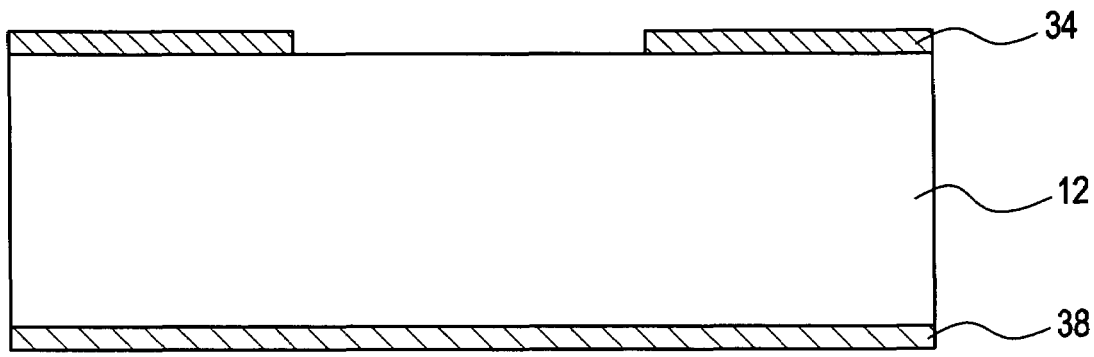
FIGS. 4(*a*)-4(*h*) collectively illustrate an exemplary method of making the embodiment of the backside absolute pressure sensor illustrated in FIG. 3.
Figure 4B:
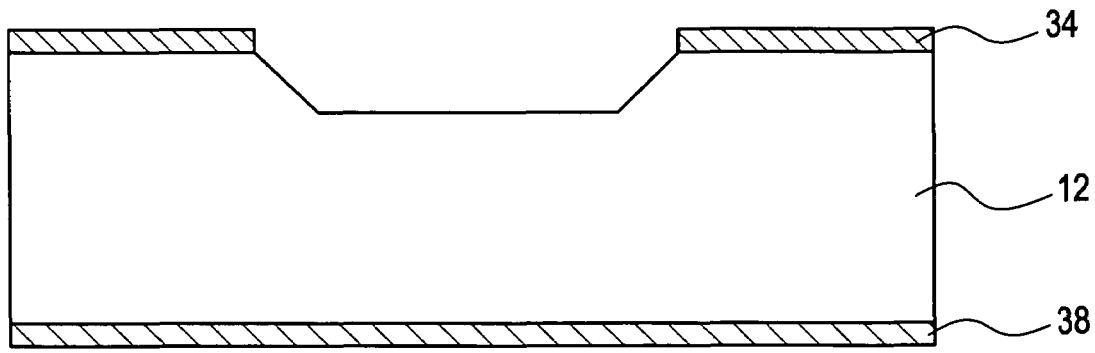
Figure 4C:
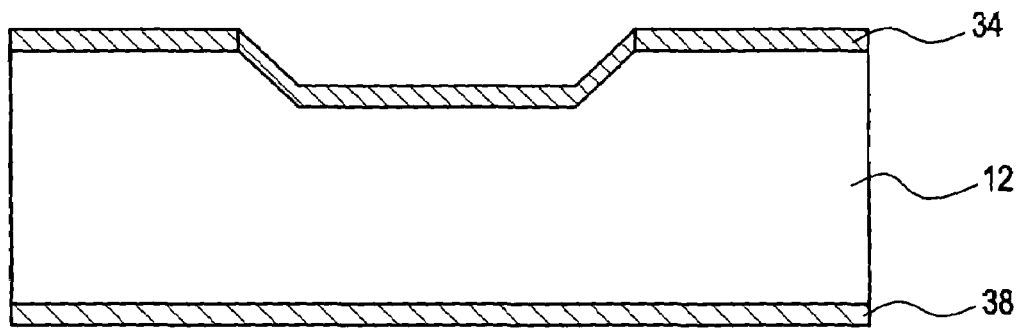
Figure 4D:
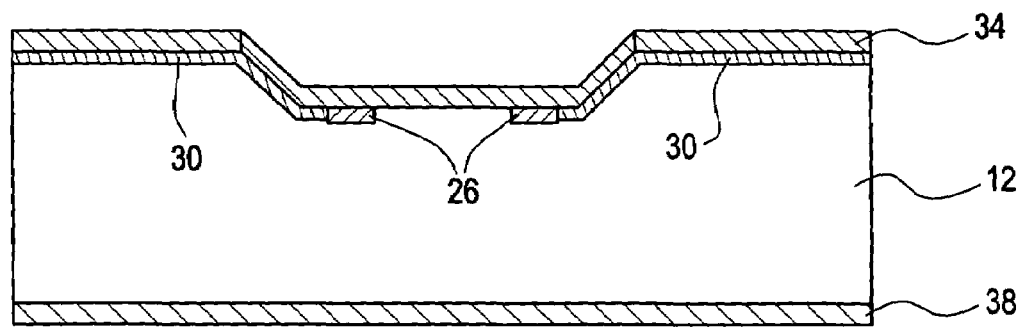
Figure 4E:
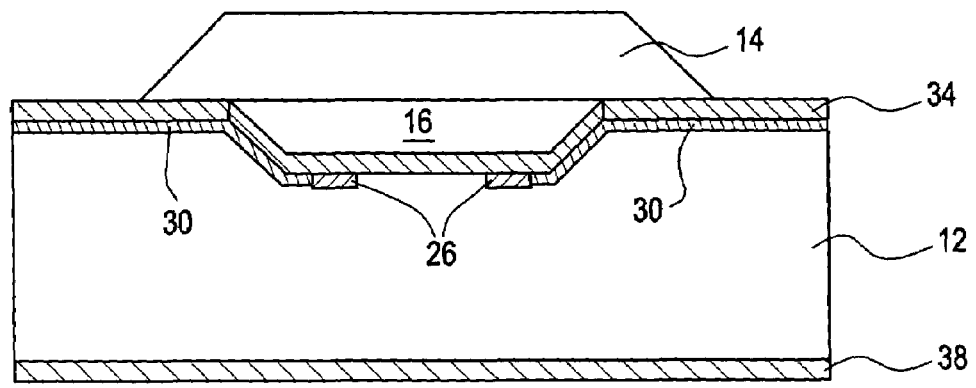
Figure 4F:
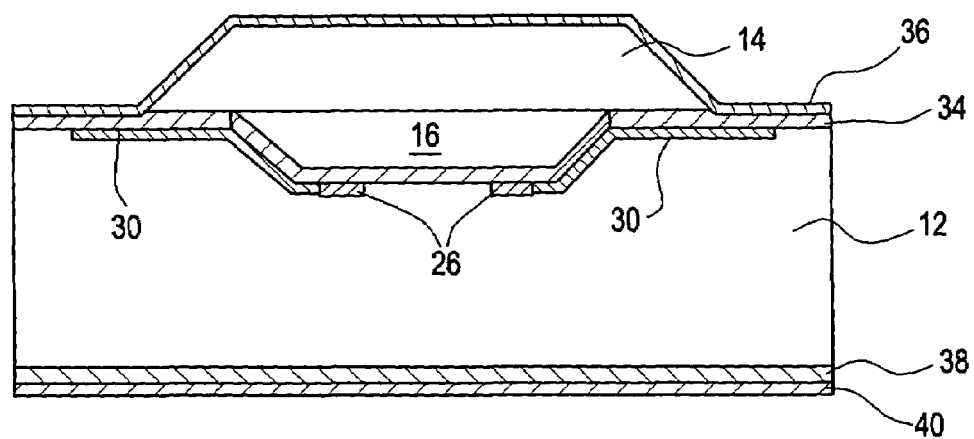
Figure 4G:
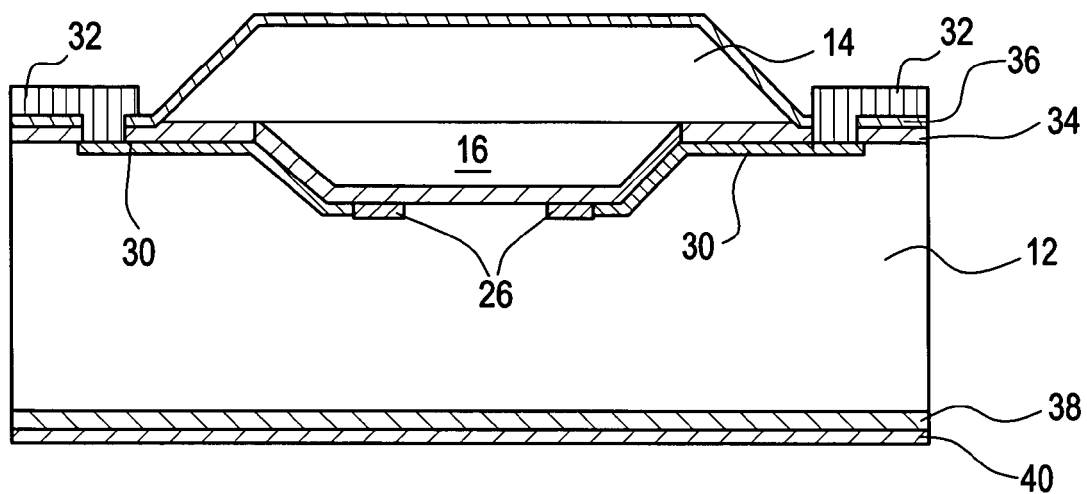
Figure 4H:
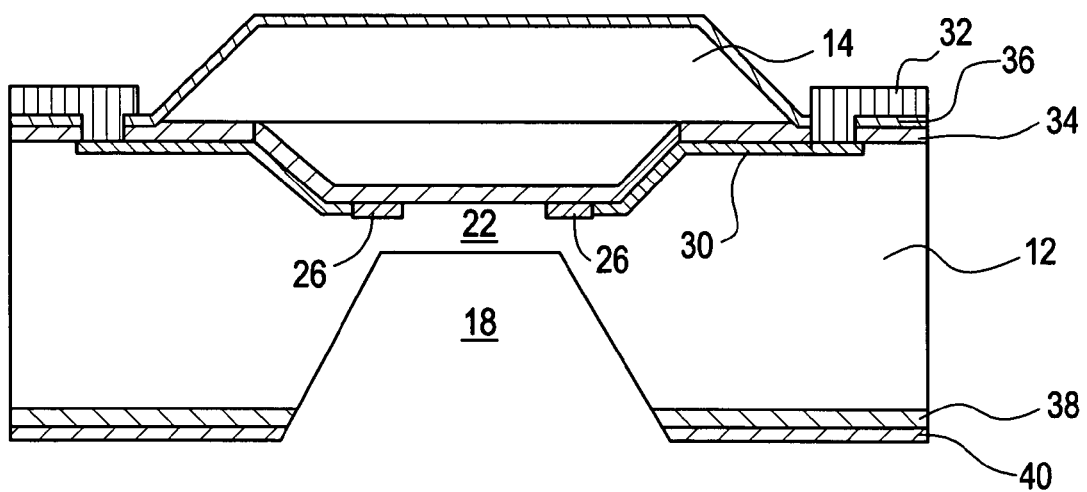

FIGS. 4(a)-4(h) collectively illustrate an exemplary method of making the embodiment of the backside absolute pressure sensor illustrated in FIG. 3. FIG. 4(a) illustrates a window being opened into the first oxide layer 34, which is further etched as illustrated in FIG. 4(b). For example, an anisotropic etchant (e.g., KOH, TMAH, EDP, and the like) can be used to form a cavity in the base substrate 12 having tapered walls. An oxide is regrown in the etched area as illustrated in FIG. 4(c). In FIG. 4(d), the piezo-resistive element 26 and the conductive pathway 30 are formed on a surface of the base substrate 12 by ion implantation, diffusion, and the like. Materials for the piezo-resistive element 26 and conductive pathway 30 include those materials discussed above. FIG. 4(e) illustrates the base substrate 12 being silicon fusion bonded to the cap substrate 14. FIG. 4(f) illustrates a silicon nitride being disposed over the first oxide layer 34 and over an outer surface of the cap substrate 14. FIG. 4(g) illustrates electrodes 32 being formed by metallization such that the electrodes electrically communicate with the conductive pathway 30. Suitable metallization techniques include those metallization techniques discussed above. FIG. 4(h) illustrates the second oxide layer 38 and the second nitride layer 40 being etched to form cavity 18 and diaphragm portion 22.

Referring now to FIG. 5, an embodiment of a differential pressure sensor, generally designated 300, is illustrated. For ease in discussion, the differential pressure sensor 300 includes a similar arrangement of components discussed in relation to absolute pressure sensors 100 and 200, with the exception that the differential pressure 300 further includes a cavity 44 disposed through the cap substrate 14. The cavity 44 exposes the chamber 16 to the environment, which allows pressure to act on the diaphragm portion 22 from both the first side 24 and the second side 28. More particularly, in operation, the diaphragm portion 22 flexes in proportion to the difference in pressure from P and $P_2$. The piezo-resistive elements 26 measure the flexion of the diaphragm portion 22 due that difference in pressure from P and $P_2$. It is briefly noted that, the absolute pressure sensors 100 and 200 can each be made into a differential pressure sensor 300 by etching the cavity 44 into the cap substrate 14. Suitable etchants include, but are not limited to, KOH and TMAH.

The resulting differential pressure sensor 300 can be fixed to a ceramic substrate by solder bumping and the like. In FIG. 5, a solder bump (shown as an elliptical shape) is disposed in physical communication with electrode 32 and a second electrode, which is disposed on a ceramic substrate. The method of forming the differential pressure sensor 300 advantageously mitigates debris and the like from being disposed in the cavity 44, which can potentially build up and block the cavity 44.

Advantageously, the absolute pressure sensors disclosed herein include a silicon fusion bond between a base substrate and a cap substrate. Further, the absolute pressure sensors are backside absolute pressure sensors. The silicon fusion bond provides a bond strength superior to other bonding techniques (e.g., an intermediate glass frit bond, an adhesive bond, and the like), which allows the pressure sensor to have a useful life of at least 10 years. Further, as briefly mentioned above, silicon fusion bonding also allows the pressure sensor to be constructed at a reduced cost compared to some present day sensors, which can offer a significant commercial advantage. Additionally, by constructing the absolute pressure sensors as a backside pressure sensors, the pressure sensors can advantageously be employed in harsh environments, since the piezo-resistive elements and conductive pathways are shielded from the environment. Again, this construction can increase the useful life of the pressure sensor compared to present day sensors.

While the invention has been described with reference to several embodiments thereof, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A pressure sensor comprising:

a base substrate comprising first and second support portions, facing surfaces of the first and second support portions comprising walls defining a first cavity, the base substrate further comprising a diaphragm portion extending between top portions of the first and second support portions, wherein the base substrate comprises silicon and wherein the first cavity is open to an environment to be sensed;

at least one bottom dielectric layer disposed on an underside of each support portion of the base substrate that do not extend past edges of the undersides of the support portions;

a cap substrate comprising silicon;

a silicon fusion bond between the cap substrate and the base substrate;

a chamber disposed between the base substrate and the cap substrate, wherein the chamber is hermetically sealed from the environment by the silicon fusion bond;

a piezo-resistive element disposed in physical communication with the diaphragm portion between the chamber and the first cavity; and a conductive pathway implanted between the base substrate and the at least one top dielectric layer, the conductive pathway connected to and extending from the piezo-resistive element to a portion of the base substrate beyond an outer edge of the cap substrate.

2. The pressure sensor of claim 1, wherein the cap substrate comprises a thickness up to about 400 micrometers.

3. The pressure sensor of claim 1, wherein the chamber is defined by a cap cavity in the cap substrate.

4. The pressure sensor of claim 1, wherein the chamber is defined by a base cavity in the base substrate, wherein the diaphragm portion is disposed between the first cavity and the base cavity.

5. The pressure sensor of claim 1, wherein the chamber is defined by a cap cavity in the cap substrate and a base cavity in the base substrate, wherein the diaphragm portion is disposed between the first cavity and the base cavity.

6. The pressure sensor of claim 1, wherein each of the base substrate and the cap substrate are not silicon-on-insulator wafers.

7. The pressure sensor of claim 1, wherein the base substrate is an n-type substrate, and the piezo-resistive element comprises a p-type dopant material.

8. The pressure sensor of claim 1, further comprising an electrode connected to the conductive pathway, wherein the electrode is in electrical communication with the piezo-resistive element via the conductive pathway, wherein the base substrate is an n-type substrate, wherein each of the conductive pathway and the piezo-resistive element comprise a p-type dopant material.

9. The pressure sensor of claim 1, further comprising an oxide layer covering at least a portion of the diaphragm portion that is in physical communication with the piezo-resistive element, and a nitride layer disposed over the oxide layer.

10. The pressure sensor of claim 1, wherein the conductive pathway sandwiched between the cap substrate and the base substrate, the conductive pathway is shielded from the environment; and the piezo-resistive element is in electrical communication with the conductive pathway.

11. The pressure sensor of claim 2, wherein the thickness is about 50 micrometers to about 150 micrometers.

12. A pressure sensor comprising:
a base substrate comprising first and second support portions, a first pair of facing surfaces of the first and second support portions comprising walls defining a lower cavity, a second pair of facing surfaces of the first and second support portions comprising walls defining an upper cavity, the base substrate further comprising a diaphragm portion extending between the first and second support portions and disposed between the lower and upper cavities, wherein upper portions of the first and second support portions define a support surface, wherein the base substrate comprises silicon, and wherein the lower cavity is open to an environment to be sensed;
a cap substrate comprising silicon, wherein the cap substrate comprises a planar bottom surface that defines a support surface of the cap substrate and an upper surface of the upper cavity, wherein the support surface of the cap substrate is disposed over the support surface of the upper portions of the first and second support portions, wherein the cap substrate is silicon fusion bonded to the base substrate such that the upper cavity forms a chamber between the base substrate and the cap substrate, wherein the chamber is hermetically sealed from the environment; and
a piezo-resistive element disposed in physical communication with the diaphragm portion.

13. The pressure sensor of claim 12, wherein the cap substrate comprises a thickness up to about 400 micrometers.

14. The pressure sensor of claim 12, wherein the thickness is about 50 micrometers to about 150 micrometers.

15. The pressure sensor of claim 12, wherein the chamber is defined by a base cavity in the base substrate, wherein the diaphragm portion is disposed between the cavity and the base cavity.

16. The pressure sensor of claim 12, wherein the base substrate is an n-type substrate, and the piezo-resistive element comprises a p-type dopant material.

17. The pressure sensor of claim 12, further comprising an electrode and a conductive pathway, wherein the electrode is in electrical communication with the piezo-resistive element via the conductive pathway, wherein the base substrate is an n-type substrate, and wherein each of the conductive pathway and the piezo-resistive element comprise a p-type dopant material.

18. The pressure sensor of claim 12, further comprising an oxide layer covering at least a portion of the diaphragm portion that is in physical communication with the piezo-resistive element, and a nitride layer disposed over the oxide layer.

19. The pressure sensor of claim 12, further comprising a conductive pathway sandwiched between the cap substrate and the base substrate, wherein the conductive pathway is shielded from the environment; and the piezo-resistive element is in electrical communication with the conductive pathway.

* * * * *